(12) United States Patent
Lee

(10) Patent No.: US 9,373,390 B1
(45) Date of Patent: Jun. 21, 2016

(54) SEMICONDUCTOR MEMORY DEVICE AND METHOD OF PROGRAMMING THE SAME

(71) Applicant: SK hynix Inc., Icheon-si Gyeonggi-do (KR)

(72) Inventor: Hee Youl Lee, Icheon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/862,257

(22) Filed: Sep. 23, 2015

(30) Foreign Application Priority Data

Apr. 30, 2015 (KR) ........................ 10-2015-0061588

(51) Int. Cl.
*G11C 11/56* (2006.01)
*G11C 7/22* (2006.01)

(52) U.S. Cl.
CPC .............. *G11C 11/5628* (2013.01); *G11C 7/22* (2013.01); *G11C 11/56* (2013.01)

(58) Field of Classification Search
CPC ....... G11C 11/5628; G11C 11/56; G11C 7/22
See application file for complete search history.

(56) References Cited

U.S. PATENT DOCUMENTS

| | | | |
|---|---|---|---|
| 2009/0010067 A1* | 1/2009 | Lee | G11C 11/5628 365/185.19 |
| 2011/0007571 A1 | 1/2011 | Park et al. | |
| 2013/0039130 A1* | 2/2013 | Lee | G11C 11/5628 365/185.19 |
| 2015/0070987 A1* | 3/2015 | Kim | G11C 16/12 365/185.03 |

FOREIGN PATENT DOCUMENTS

KR 1020100088917 A 8/2010

* cited by examiner

*Primary Examiner* — Douglas King
*Assistant Examiner* — Ajay Ojha
(74) *Attorney, Agent, or Firm* — William Park & Associates Ltd.

(57) ABSTRACT

A semiconductor memory device, may include a memory cell array including memory cells, in which a page to be programmed within the memory cell array may include: a first memory cell programmed in a first program state; a second memory cell programmed in a second program state; and a third memory cell programmed in a third program state, and the second program state has a threshold voltage distribution higher than that of the first program state by one step or more, and a threshold voltage distribution lower than that of the third program state by one step or more, and a first main verification voltage for verifying the first program state is used as a third pre-verification voltage for verifying the third program state.

16 Claims, 10 Drawing Sheets

SEMICONDUCTOR MEMORY DEVICE AND METHOD OF PROGRAMMING THE SAME

CROSS-REFERENCE TO RELATED APPLICATION

The present application claims priority to Korean patent application number 10-2015-0061588 filed on Apr. 30, 2015, in the Korean Intellectual Property Office, the entire disclosure of which is incorporated by reference herein.

BACKGROUND

1. Technical Field

The present invention generally relates to an electronic device, and more particularly, to a semiconductor memory device and a method of programming the same.

2. Related Art

Existing Hard Disk Drives that rotate a physical disk are relatively slower, heavier, and larger, than semiconductor memory devices. Thus, the use of semiconductor memory devices has increased.

A semiconductor memory device is a memory device implemented by using a semiconductor, such as silicon (Si), germanium (Ge), gallium arsenide (GaAs), an indium phosphide (InP). Semiconductor memory devices are generally classified into volatile memory devices and nonvolatile memory devices.

Stored data dissipates from a volatile memory device when a power supply is cut from the device. The volatile memory device includes a Static RAM (SRAM), a Dynamic RAM (DRAM), a Synchronous DRAM (SDRAM), and the like. Stored data is maintained within the nonvolatile memory device even though a power supply is cut from the device. The nonvolatile memory device includes a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is generally divided into a NOR type and a NAND type.

Recently, research to increase the number of bits programmed in one memory cell has been conducted. However, when the number of bits programmed in one memory cell is increased, various levels of voltages need to be supplied in order to verify a program progress state. Accordingly, the time needed for the programming may be increased.

SUMMARY

According to an embodiment, a method for operating a semiconductor memory device may be provided. The method may include a plurality of memory cells configured to have one program state among a first through Nth program states, wherein each one of the first through Nth program states is respectively indicated based on threshold voltages of the plurality of memory cells. The method may include applying a program pulse to a selected word line connected to the plurality of memory cells. The method may include performing a pre-verification to verify program states of the plurality of memory cells using a pre-verify voltage. The method may include performing, if a result of the pre-verification is determined to have passed, a main-verification to verify the program states of the plurality of memory cells using a main-verify voltage. The pre-verify voltage of (k)th program state among the first through Nth program states has a same voltage level with the main verify voltage of (k−2)th program state.

According to an embodiment, a method for operating a semiconductor memory device may be provided. The method may include a plurality of memory cells configured to have one program state among a first through Nth program states, wherein each one of the first through Nth program states is respectively indicated based on threshold voltages of the plurality of memory cells. The method may include applying a program pulse to a selected word line connected to the plurality of memory cells. The method may include performing a pre-verification to verify program states of the plurality of memory cells using a pre-verify voltage. The method may include performing, if a result of the pre-verification is determined to have passed, a middle-verification to verify the program states of the plurality of memory cells using a mid-verify voltage. The method may include performing, if a result of the middle-verification is determined to have passed, a main-verification to verify the program states of the plurality of memory cells using a main-verify voltage. The pre-verify voltage of (k)th program state among the first through Nth program states may have a same voltage level with the main verify voltage of (k−2)th program state and the middle verify voltage of (k−1)th program state.

According to an embodiment, a semiconductor memory device may be provided. The semiconductor memory device, may include a memory cell array including a plurality of memory cells configured to have one program state among a first through Nth program states. Each one of the first through Nth program states may be respectively indicated based on threshold voltages of the plurality of memory cells. The semiconductor memory device may include a control logic configured to apply a program pulse to a selected word line connected to the plurality of memory cells, to perform a pre-verification to verify program states of the plurality of memory cells using a pre-verify voltage and to perform, if a result of the pre-verification is determined to have passed, a main-verification to verify the program states of the plurality of memory cells using a main-verify voltage. The pre-verify voltage of (k)th program state among the first through Nth program states may have a same voltage level with the main verify voltage of (k−2)th program state.

DETAILED DESCRIPTION

Figure 1:
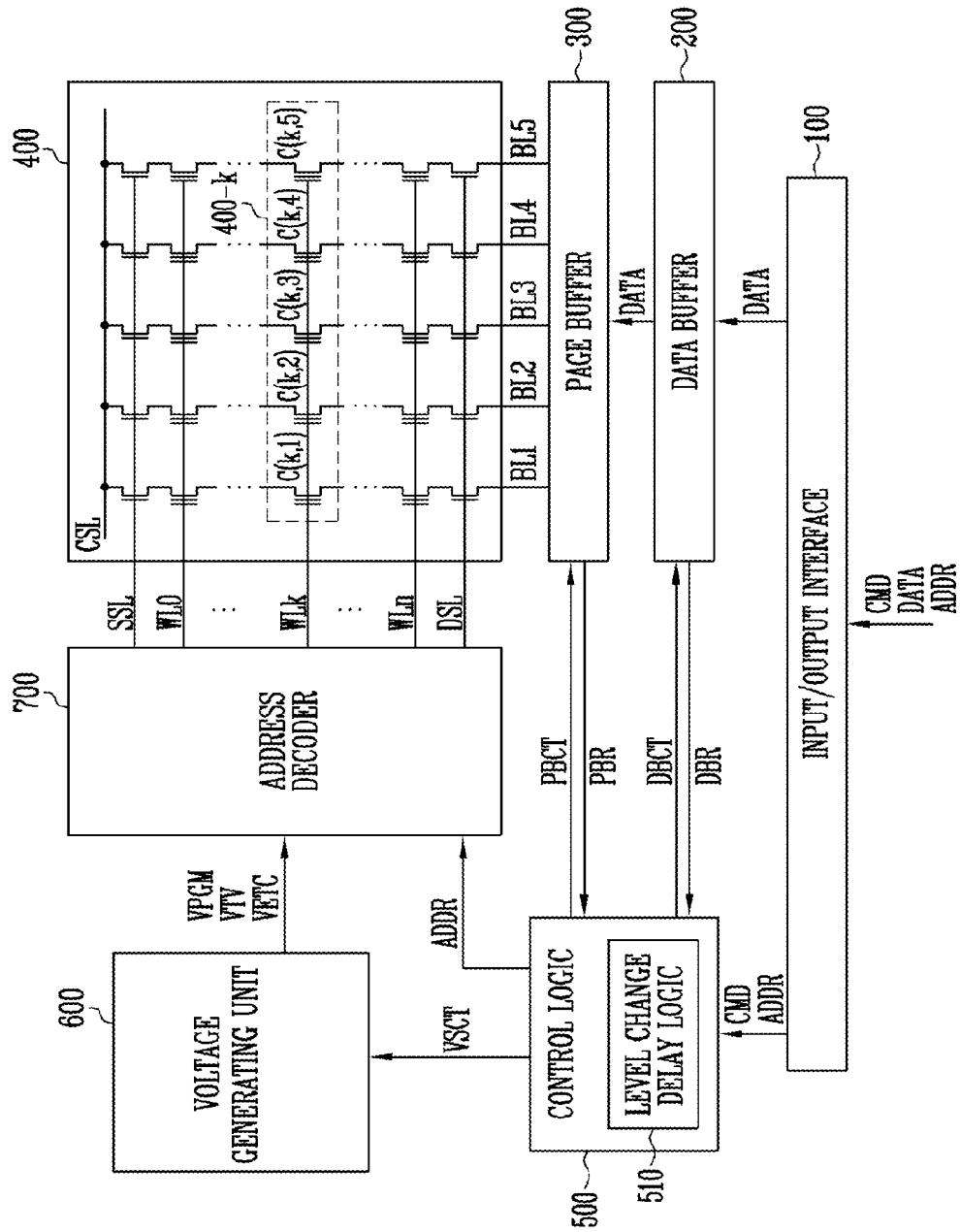
FIG. 1 is a diagram illustrating a representation of an example of a semiconductor memory device for describing an example of an embodiment.

Hereinafter, various examples of embodiments will be described in below with reference to the accompanying drawings. Like reference numerals principally refer to like elements throughout the specification. In the following description, when the detailed description of the relevant known function or configuration is determined to unnecessarily obscure the important point of the present embodiment, the detailed description is not provided. Further, a name of a constituent elements used in description below may be selected in consideration of easiness of writing the specification, and thus may be different from a name of a component of an actual product.

Some embodiments may provide a semiconductor memory device capable of decreasing a time taken for programming and a method of programming the same.

Some embodiments may provide a semiconductor memory device capable of decreasing a time taken for programming by sufficiently securing a gap between a pre-verification voltage and a main verification voltage corresponding to one memory cell, and a method of programming the same.

Some embodiments may provide a semiconductor memory device capable of decreasing a time taken for programming and decreasing a distribution width of threshold voltages according to a program by using a pre-verification voltage, a middle verification voltage, a main verification voltage of a corresponding state when a program progress state of one memory cell is verified, and the method of programming the same.

Some embodiments may provide the semiconductor memory device having a reduced time taken for programming, and the method of programming the same.

FIG. 1 is a diagram illustrating a representation of an example of a semiconductor memory device for describing an example of an embodiment. Referring to FIG. 1, the semiconductor memory device may include an input/output interface 100, a data buffer 200, a page buffer 300, a memory cell array 400, a control logic 500, a voltage generating unit 600, and an address decoder 700.

The input/output interface 100 receives a command CMD and data DATA from the outside (not illustrated). When the command CMD is a program command, the input/output interface 100 may further receive an address ADDR, to which the data DATA is to be programmed, from the outside (not illustrated).

The data buffer 200 receives data DATA from the input/output interface 100. The data buffer 200 may receive data DATA in response to a data buffer control signal DBCT from the control logic 500, and may transmit a data buffer response signal DBR to the control logic 500 when the reception is completed.

The page buffer 300 receives data DATA from the data buffer 200. The page buffer 300 may receive data DATA in response to a page buffer control signal PBCT from the control logic 500, and transmit a page buffer response signal PBR to the control logic 500 when the reception is completed.

The memory cell array includes pages, and each page includes memory cells. Gate electrodes of the memory cells within the pages are electrically connected to the word lines WL0, ..., WLk, ..., and WLn (k is a positive integer, and n is a positive integer larger than k), and one end of cell strings of the memory cell array 400 is connected to bit lines BL1, BL2, BL3, BL4, and BL5, and the other end is connected to a common source line CSL. It may be assumed that data DATA is programmed in a page 400-$k$ in response to the program command from the outside (not illustrated). That is, in the description below, a page to be programmed is the page 400-$k$, and a program word line is a word line WLk. The page 400-$k$ to be programmed may include memory cells (k, 1), C(k, 2), C(k, 3), C(k, 4), and C(k, 5), and the memory cells C(k, 1), C(k, 2), C(k, 3), C(k, 4), and C(k, 5) may correspond to the bit lines BL1, BL2, BL3, BL4, and BL5, respectively. A level of a voltage supplied to the bit lines BL1, BL2, BL3, BL4, and BL5 may be determined based on the data DATA and whether the programming of the corresponding cells C(k, 1) to C(k, 5) is completed. Gate electrodes of transistors included in the memory cell string may be electrically connected to a source select line or a data select line DSL. The number of bit lines is only an example and the embodiments are not limited in this manner.

The control logic 500 controls the data buffer 200 based on the transmission of the data buffer control signal DBCT to the data buffer 200, and controls the page buffer 300 based on the transmission of the page buffer control signal PBCT to the page buffer 300. The control logic 500 controls the voltage generating unit 600 based on the transmission of a voltage generating unit control signal VSCT. When an address ADDR is received from the outside (not illustrated), the control logic 500 transmits the address ADDR to the address decoder 700. When the address ADDR is not received from the outside (not illustrated), the control logic 500 determines an address ADDR based on an internal algorithm, and transmits the determined address ADDR to the address decoder 700. According to an example of an embodiment, the control logic 500 may include a level change delay logic 510, and the level change delay logic 510 may change a level of a voltage to be supplied to a bit line and delay an increase of a program voltage to be supplied to the page 400-$k$ in response to a change of a threshold voltage. The control logic 500 may determine whether a state changed memory cell exists, and when the state changed memory cell exists, the level change delay logic 510 may change a level of a voltage to be supplied to the bit line and delay an increase of the program voltage to be supplied to the page 400-$k$. The level change delay logic 510 will be described below.

The voltage generating unit 600 generates voltages supplied to the word lines WL0 to WLn of the memory cell array 400. The voltages include a program voltage VPGM, total verification voltages VTV, and other voltages VETC. The program voltage VPGM and the total verification voltages VTV may be supplied to the program word line WLK, and other voltages VETC may be supplied to the remaining word lines WL0 to WLK−1, and WLK+1 to WLn, the source select line SSL, and the drain select line DSL. A level of the program voltage VPGM is determined based on a level of the voltage generating unit control signal VSCT.

The address decoder 700 may receive an address ADDR from the control logic 500, and supply one of the voltages VPGM, VTV, and VETC from the voltage generating unit 600 to one of the word lines, the source select line, and data select line WL0 to WLn, SSL, and DSL.

Figure 2:
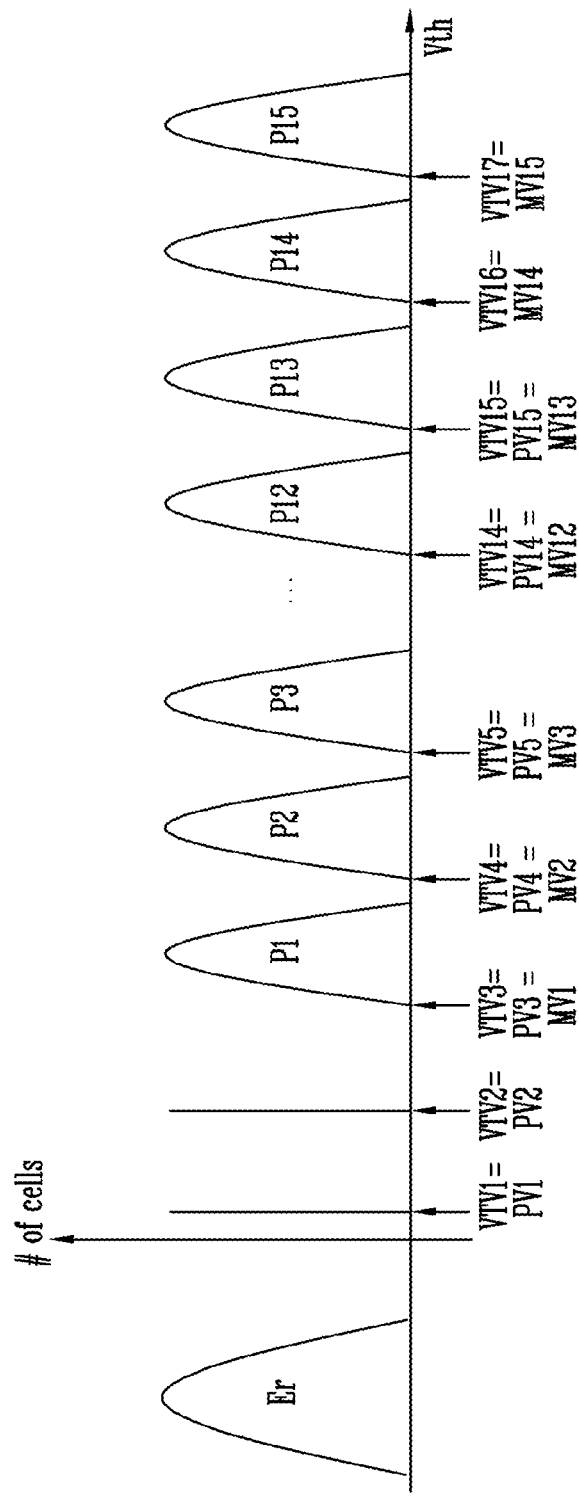
FIG. 2 is a diagram illustrating a representation of an example of threshold voltages of memory cells within a page to be programmed of FIG. 1 and verification voltages supplied to a program word line for describing an example of an embodiment.

FIG. 2 is a diagram illustrating a representation of an example of threshold voltages of memory cells within a page to be programmed of FIG. 1 and verification voltages supplied to a program word line for describing an example of an embodiment. Hereinafter, threshold voltages of memory cells within a page to be programmed and verification voltages supplied to a program word line will be described with reference to FIGS. 1 and 2.

FIG. 2 is a diagram for describing a method of storing four bits in one memory cell, and the state may be divided into a non-program state Er, and first to fifteenth states P1 to P15 in order of a threshold voltage. However, the number of bits stored in one memory cell and the number of states are simply an example and the embodiments are not limited in this manner. When data is programmed in the page 400-k to be programmed, it is verified whether the page 400-k is properly programmed, and a threshold voltage of each of the memory cells C(k, 1), C(k, 2), C(k, 3), C(k, 4), and C(k, 5) is equal to or larger than a specific voltage. A method of performing pre-verification and main verification by using a pre-verification voltage and a main verification voltage on one memory cell may be used. However, when pre-verification voltages and main verification voltages having different levels are generated for the 15 states P1 to P15, respectively, there may be a problem in that a time taken for the programming is increased. In a case where the verification is performed by using the pre-verification voltage and the main verification voltage, when a threshold voltage of the memory cell is smaller than a pre-verification voltage of a corresponding state, it may be determined that the memory cell is a first progressing state, when the threshold voltage of the memory cell is larger than the pre-verification voltage of the corresponding state and smaller than a main verification voltage of the corresponding state, it may be determined that the memory cell is a second progressing state, and when the threshold voltage of the memory cell is larger than the main verification voltage of the corresponding state, it may be determined that the memory cell is a third progressing state. The first to third progressing states mean program progressing states of the memory cells C(k, 1) to C(k, 5). The memory cell having the first progressing state requires the fastest change of the threshold voltage, the memory cell having the second progressing state requires a slow change of the threshold voltage, and the memory cell having the third progressing state is completely programmed, so that the memory cell does not require a change of the threshold voltage.

The total verification voltages VTV in an example of an embodiment may include first to seventeenth total verification voltages VTV1 to VTV17. First to fifteenth total verification voltages VTV1 to VTV15 among the total verification voltages VTV correspond to pre-verification voltages PV1 to PV15 used in the pre-verification of the first to fifteenth states P1 to P15, respectively, and third to seventeenth total verification voltages VTV3 to VTV17 correspond to main verification voltages MV1 to MV15 used in the main verification of the first to fifteenth states P1 to P15, respectively. Accordingly, the main verification voltage MV1 for verifying the first state P1 is used as the pre-verification voltage PV3 for verifying the third state P3. Particularly, the first state P1 may be main-verified and the third state P3 may pre-verified by using a third verification voltage VTV3 corresponding to the main verification voltage MV1 of the first state P1 and the pre-verification voltage PV3 of the third state P3. For convenience of the description, it may be assumed that a first memory cell, a second memory cell, and a third memory cell are the memory cell C(k, 1), the memory cell C(k, 2), and the memory cell C(k, 3), respectively. A first program state corresponding to the memory cell C(k, 1) may be one of the first to fifteenth state P1 to P15, a second program state corresponding to the memory cell C(k, 2) may be one of the second to sixteenth state P2 to P16, and the third program state corresponding to the memory cell C(k, 3) may be one of the third to seventeenth state P3 to P17. For convenience of the description, it may be assumed that the first program state is the first state P1, the second program state is the second state P2, and the third program state is the third state P3. However, this is simply an example of a case where the second program state has a threshold voltage distribution higher than that of the first program state by one step or more, and a threshold voltage distribution lower than that of the third program state by one step or more. The main verification voltage MV1 for verifying the first state P1 corresponding to the memory cell C(k, 1) may be used as the pre-verification voltage PV3 for verifying the third state P3 corresponding to the memory cell C(k, 3). After the program is completed, the threshold voltage of the memory cell C(k, 2) is larger than the threshold voltage of the memory cell C(k, 1) and smaller than the threshold voltage of the memory cell C(k, 3). A level difference between the pre-verification voltage (PV=VTV1) used for the pre-verification and the main verification voltage MV1=VTV3 used in the main verification of the memory cell C(k, 1) is sufficiently secured, so that a section determined to have the second progressing state is increased, thereby decreasing a distribution width of the threshold voltages through the programming. Further, the distribution width of the threshold voltages may be decreased, so that an increase width of the program voltage in an Increment Step Pulse Program (ISPP) method may be large, so that a program time may be decreased.

Figure 3:
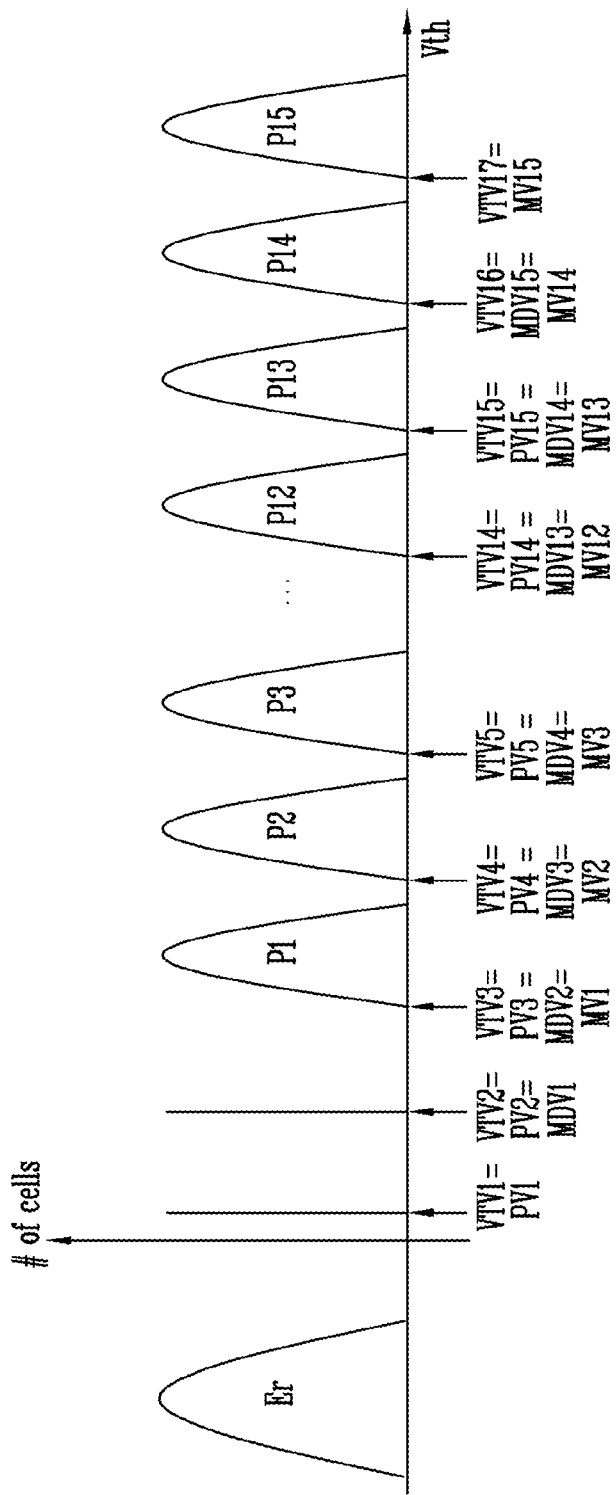
FIG. 3 is a diagram illustrating a representation of an example of threshold voltages of memory cells within a page to be programmed of FIG. 1 and verification voltages supplied to a program word line for describing an example of an embodiment.

FIG. 3 is a diagram illustrating a representation of an example of threshold voltages of memory cells within a page to be programmed of FIG. 1 and verification voltages supplied to a program word line for describing an example of an embodiment. FIG. 3 is considerably similar to FIG. 2, but is different from FIG. 2 in that a middle verification voltage is added.

In FIG. 3, a pre-verification, a middle verification, and a main verification are performed on one memory cell by using a pre-verification voltage, a middle verification voltage, and a main verification voltage. In a case where the verification is performed by using a pre-verification voltage, a middle verification voltage, and a main verification voltage, when a threshold voltage of a memory cell is smaller than a pre-verification voltage of a corresponding state, the memory cell may be determined to have the first progressing state, and when the threshold voltage of the memory cell is larger than the pre-verification voltage of the corresponding state and smaller than a middle verification voltage of the corresponding state, the memory cell may be determined to have the second progressing state. Further, when the threshold voltage of the memory cell is larger than the middle verification voltage of the corresponding state and smaller than a main verification voltage of the corresponding state, the memory cell may be determined to have the third progressing state, when the threshold voltage of the memory cell is larger than the main verification voltage of the corresponding state, the memory cell may be determined to have the fourth progressing state. The first to fourth progressing states mean program progressing states of the memory cells C(k, 1) to C(k, 5). The memory cell having the first progressing state requires the fastest change of the threshold voltage, the memory cell having the second progressing state requires a slow change of the threshold voltage, the memory cell having the third progressing state requires a slower change of the threshold voltage, and the memory cell having the fourth progressing state is completely programmed, so that the memory cell does not require a change of the threshold voltage. When the three verification voltages (the pre-verification voltage, the middle verification voltage, and the main verification voltage) are used for one program state, a program time may be decreased and a distribution width of the threshold voltages by the program may be decreased compared to the examples where the two verification voltages (the pre-verification voltage and the main verification voltage) are used.

The total verification voltages VTV in FIG. 3 include the first to the seventeenth total verification voltages VTV1 to VTV17. The first to fifteenth total verification voltages VTV1 to VTV15 among the total verification voltages VTV correspond to the pre-verification voltages PV1 to PV15 used for the pre-verification of the first to fifteenth states P1 to P15, respectively, the second to sixteenth total verification voltages VTV2 to VTV16 correspond to the middle verification voltages MDV1 to MDV15 used for the middle verification of the first to fifteenth states P1 to P15, respectively, and the third to seventeenth total verification voltages VTV3 to VTV17 correspond to the main verification voltages MV1 to MV15 used for the main verification of the first to fifteenth states P1 to P15, respectively.

For convenience of the description, it may be assumed that a first memory cell, a second memory cell, and a third memory cell are the memory cell C(k, 1), the memory cell C(k, 2), and the memory cell C(k, 3), respectively. Further, it may be assumed that the first program state corresponding to the memory cell C(k, 1) is the first state P1, the second program state corresponding to the memory cell C(k, 2) is the second state P2, and the third program state corresponding to the memory cell C(k, 3) is the third state P3. However, this is simply an example of a case where the second program state has a threshold voltage distribution higher than that of the first program state by one step or more, and a threshold voltage distribution lower than that of the third program state by one step or more. The main verification voltage (MV1=VTV3) for verifying the first state P1 corresponding to the memory cell C(k, 1) may be used as the pre-verification voltage (PV3=VTV3) for verifying the third state P3 of the memory cell C(k, 3), and the main verification voltage (MV2=VTV4) for verifying the second state P2 corresponding to the memory cell C(k, 2) may be used as the middle verification voltage (MDV3=VTV4) for verifying the third state P3 of the memory cell C(k, 3). After the program is completed, the threshold voltage of the memory cell C(k, 2) is larger than the threshold voltage of the memory cell C(k, 1) and smaller than the threshold voltage of the memory cell C(k, 3).

Figure 4:
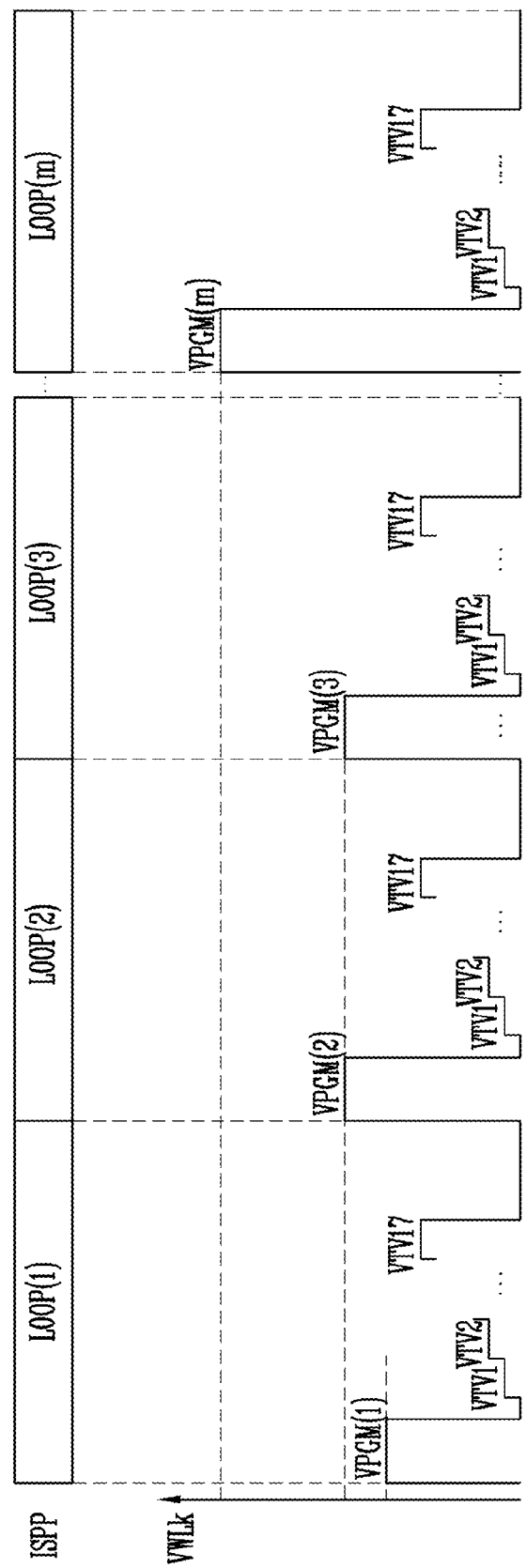
FIG. 4 is a diagram illustrating a representation of an example for describing voltages supplied to the program word line of FIG. 1.

FIG. 4 is a diagram illustrating a representation of an example for describing voltages supplied to the program word line (i.e., VWLK) of FIG. 1.

In the present invention, the program voltage VPGM may be supplied in a pulse form, and a level of the program voltage VPGM may be increased at least once according to the elapse of time. This method is referred to as the incremental step pulse programming (ISPP) method. The ISPP method verifies a program progressing state of each memory cell by using a verification voltage after applying a program voltage.

In the first loop LOOP(1) of the ISPP method, the first program voltage VPGM(1) is supplied to the program word line WLK. Then, the total verification voltages VTV1 to VTV17 are supplied to the program word line WLK. The threshold voltages of the memory cells within the page 400-$k$ to be programmed may be measured by using the total verification voltages VTV1 to VTV17, and thus the progressing states of the memory cells C(k, 1) to C(k, 5) may be determined. After the first loop LOOP(1) is terminated, the second loop LOOP(2) is performed. The second program voltage VPGM(2) is supplied to the program word line WLK. Here, a level of the second program voltage VPGM(2) is larger than a level of the first program voltage VPGM(1). That is, the level of the program voltage is increased at least once according to the elapse of time.

According to an example of an embodiment, when a predetermined condition is satisfied, the level of the program voltage may be maintained even though time passes. The predetermined condition is that at least one state changed memory cells exist within the page 400-$k$ to be programmed. When the memory cell (for example, the memory cell C(k, 1)) within the page 400-$k$ to be programmed is in the first progressing state before the program voltage VPGM(2) is supplied, and is in the second progressing state after the program voltage VPGM(2) is supplied, the memory cell C(k, 1) is set to a state changed memory cell. A level of the third program voltage VPGM(3) is the same as the level of the second program voltage VPGM (2). The predetermined condition and the state changed memory cell will be described below with reference to FIGS. 5, 6, and 8.

When the threshold voltages of all of the memory cell C(k, 1) to C(k, 5) within the page 400-$k$ to be programmed are larger than the main verification voltage of the corresponding program state after the $m^{th}$ (m is a positive integer) program voltage VPGM(m) is supplied, all of the memory cells within the page 400-$k$ to be programmed are properly programmed, so that the supply of the program voltage is stopped.

Figure 5:
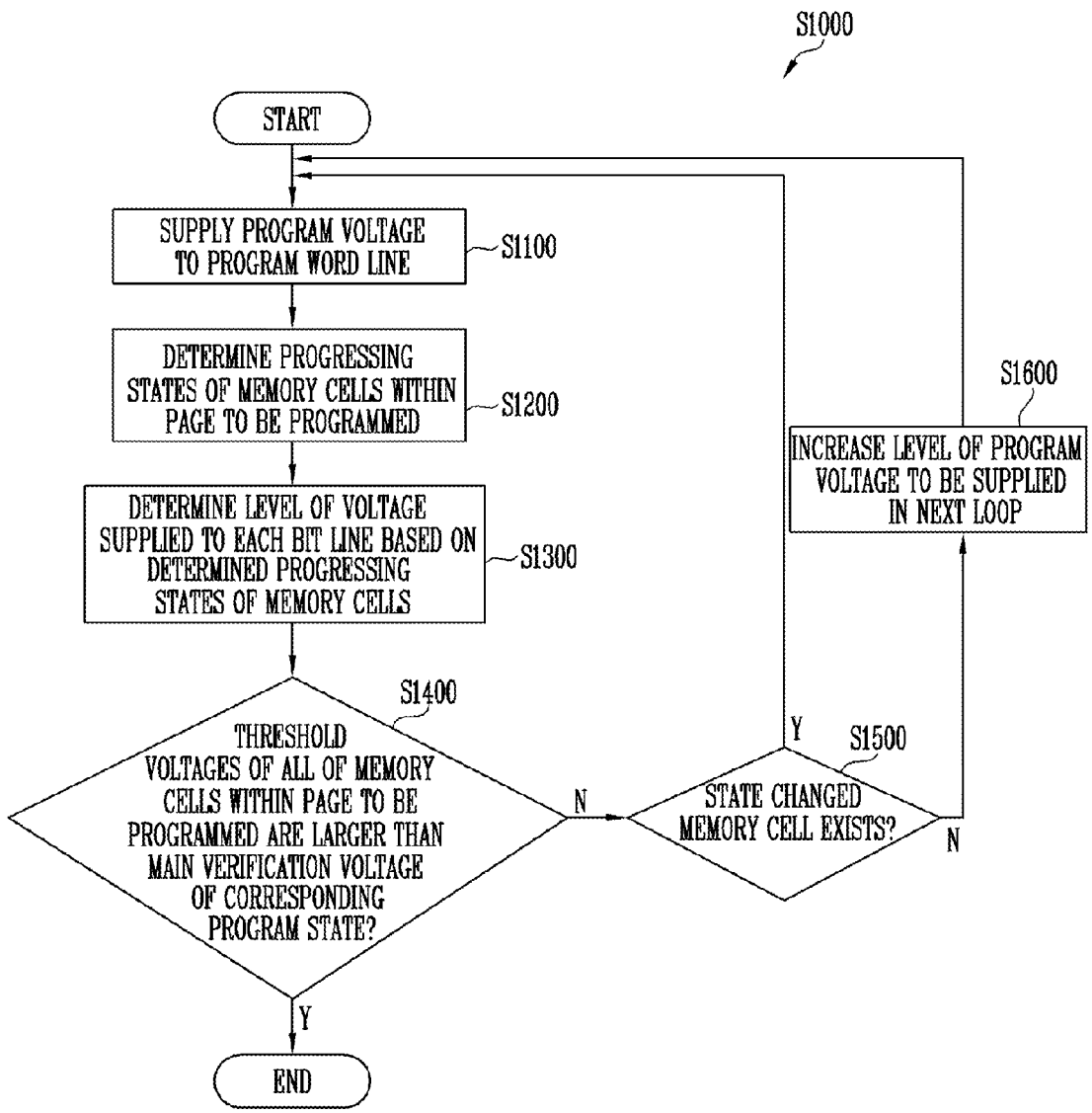
FIG. 5 is a diagram for describing a method of programming the semiconductor memory device according to an example of an embodiment.

FIG. 5 is a diagram for describing a method of programming the semiconductor memory device according to an example of an embodiment. Hereinafter, a method 51000 of programming the semiconductor memory device will be described with reference to FIGS. 1 to 5.

In operation S1100, a program voltage is supplied to the program word line WLk. In the first loop LOOP(1), the program voltage VPGM(1) is supplied to the program word line WLK.

In operation S1200, the total verification voltages VTV1 to VTV17 are supplied to the program word line WLK. Then, progressing states of the memory cells C(k, 1) to C(k, 5) within the page 400-$k$ to be programmed are determined. Operation S1200 will be described with reference to FIG. 5 or 6 below.

In operation S1300, a level of a voltage to be supplied to each of the bit lines BL1 to BL5 is determined based on the determined processing states of the memory cells C(k, 1) to C(k, 5). Operation S1300 will be described with reference to FIG. 7 or 8 below.

In operation S1400, it is determined whether the threshold voltages of all of the memory cells C(k, 1) to C(k, 5) are larger than the main verification voltage of the corresponding program state. When the threshold voltages of all of the memory cells C(k, 1) to C(k, 5) are larger than the main verification voltage of the corresponding program state, it is determined that it is not necessary to additionally supply the program voltage, so that an additional supply of the program voltage is stopped. Otherwise, operation S1500 is performed.

In operation S1500, it is determined whether a state changed memory cell exists. When the state changed memory cell exists, operation S1100 is performed. For example, when the state changed memory cell exists after the second program voltage VPGM(2) is supplied, a level of the program voltage VPGM(3) to be supplied thereafter is the same as the level of the second program voltage VPGM(2). When the state changed memory cell does not exist, operation S1600 is performed. Operation S1500 is an optional operation, so that operation S1500 may be omitted. When operation S1500 is omitted, operation S1600 is performed after operation S1400.

In operation S1600, a level of a program voltage to be supplied in a next loop is increased. For example, when the first loop LOOP(1) is performed, a level of a program voltage to be supplied in the second loop LOOP(2) that is the next loop is increased by operation S1600.

One loop (one of the loops LOOP(1) to LOOP(m)) illustrated in FIG. 4 correspond to one performance of operations S1100 to S1600.

Figure 6:
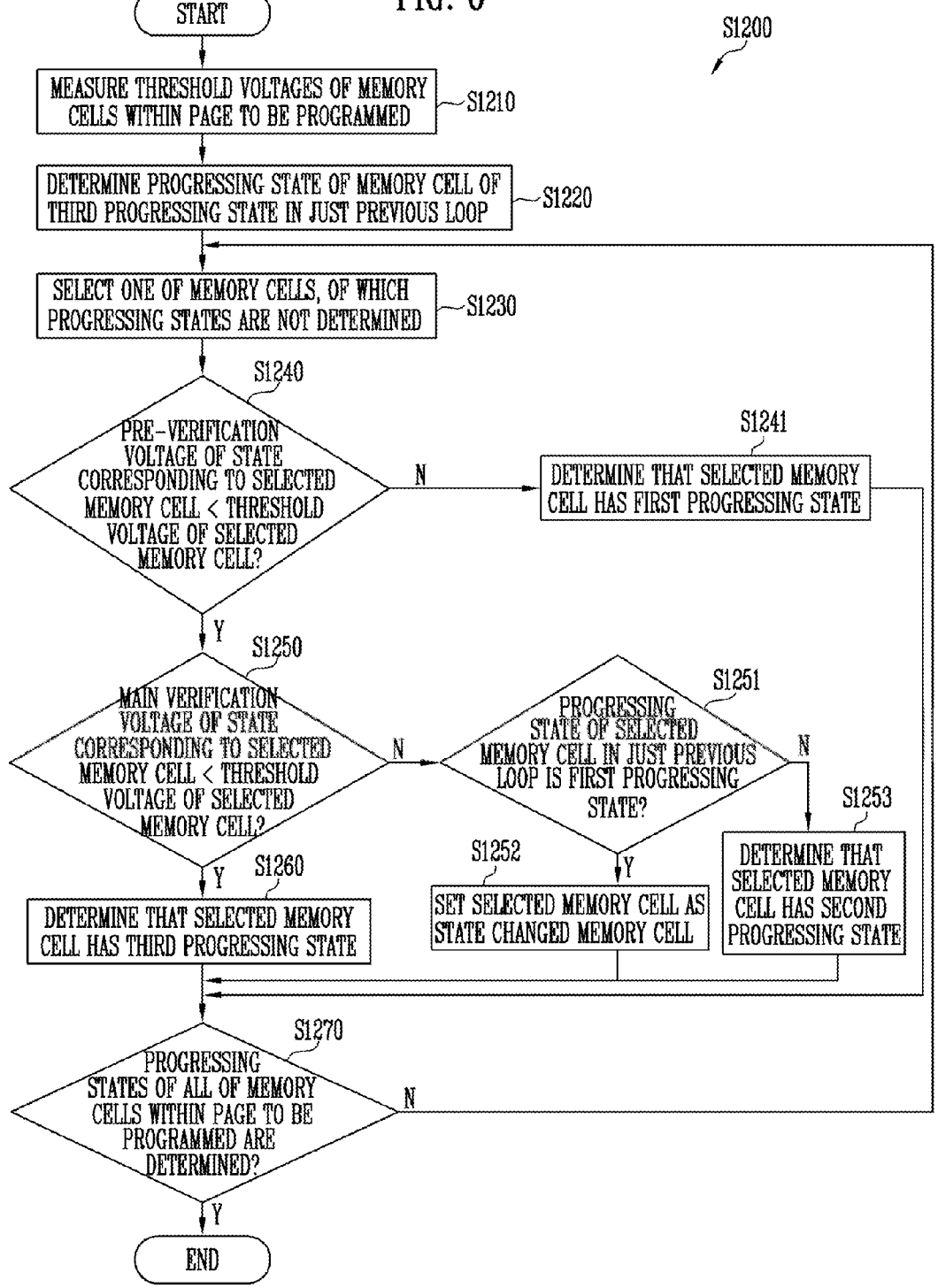
FIG. 6 is a flowchart for describing an example of an embodiment of operation S1200 of FIG. 5.

FIG. 6 is a flowchart for describing an example of an embodiment of operation S1200 of FIG. 5. Hereinafter, operation S1200 will be described with reference to FIGS. 1, 2, 4, 5, and 6.

In operation S1210, the threshold voltages of the memory cells C(k, 1) to C(k, 5) within the page 400-$k$ to be programmed are measured. The threshold voltages of the memory cells C(k, 1) to C(k, 5) within the page 400-$k$ to be programmed are measured by using the total verification voltages VTV1 to VTV17 supplied to the program word line WLK.

In operation S1220, a progressing state of the memory cell, which is in the third progressing state in the just previous loop, is determined. The memory cell, which has been in the third progressing state, is not programmed or erased, so that the progressing state of the memory cell is not changed any longer. Accordingly, the memory cell, which is determined to have the third progressing state once, may be determined to have the third progressing state without a separate comparison. In a case where it is determined whether the state changed memory cell exists and the memory cell is set to a state changed memory cell, when the change of a level of the program voltage and the change of a progressing state change of the state changed memory cell are delayed by the predetermined number of times of delay, a progressing state of the memory cell, of which the state is changed, may also be determined in operation S1220. In this case, the memory cell, of which the state is changed, may be determined to have the first progressing state without a separate comparison. When the predetermined number of times of delay is q (q is a positive integer), a counter is decreased by each one instead of the determination of the state changed memory cell to have the first progressing state. When the loop is performed q times after the specific memory cell is set to the state changed memory cell, the setting of the specific memory cell to the state changed memory cell is released. That is, when the specific cell is set to the state changed memory cell in a loop before the performance of the loop by the predetermined number of times, the setting of the specific memory cell to the state changed memory cell may be released. Operation S1220 is an optional operation, so that operation S1220 may be omitted.

In operation S1230, one of the memory cells, of which the progressing states are not determined, is selected. According to an example of an embodiment, when operation S1220 is performed, the memory cell may be determined to have the third state in the previous loop, or a progressing state of the memory cell set as the state changed memory cell may already have been completely determined. One of the memory cells, except for the memory cell, of which the progressing state has been already determined, is selected. When operation S1220 is omitted, one of all of the memory cells C(k, 1) to C(k, 5) is selected. For convenience of the description, it is assumed that the selected memory cell is the memory cell C(k, 1), and the memory cell C(k, 1) needs to be programmed to have the first state P1.

In operation S1240, the threshold voltage of the memory cell C(k, 1) is compared with the pre-verification voltage (PV1=VTV1) of the state P1 corresponding to the memory cell C(k, 1). When the threshold voltage of the memory cell C(k, 1) is smaller than the pre-verification voltage PV1, operation S1241 is performed. When the threshold voltage of the memory cell C(k, 1) is larger than the pre-verification voltage PV1, operation S1250 is performed.

In operation S1241, the memory cell C(k, 1) is determined to have the first progressing state.

In operation S1250, the threshold voltage of the memory cell C(k, 1) is compared with the main verification voltage (MV1=VTV3) of the state P1 corresponding to the memory cell C(k, 1). The main verification voltage (MV1=VTV3) of the state P1 may be used as the pre-verification voltage (PV3=VTV3) of the state P3. When the threshold voltage of the memory cell C(k, 1) is smaller than the main verification voltage MV1, operation S1251 is performed. When the threshold voltage of the memory cell C(k, 1) is larger than the main verification voltage MV1, operation S1260 is performed.

In operation S1251, it is determined whether the progressing state of the memory cell C(k, 1) in a just previous loop is the first progressing state. When the progressing state of the memory cell C(k, 1) in a just previous loop is the first progressing state, operation S1252 is performed, and otherwise, operation S1253 is performed. In an example of an embodiment, in which whether the state changed memory cell exists is not determined, operation S1251 may be omitted. In this case, when the threshold voltage of the memory cell C(k, 1) is smaller than the main verification voltage MV1, operation S1253 is performed. In an example of an embodiment, in which whether the state changed memory cell exists is not determined, operation S1253 is performed regardless of the progressing state of the memory cell C(k, 1) in the just previous loop.

In operation S1252, the memory cell C(k, 1) is set to the state changed memory cell. After the setting, a counter of the memory cell C(K, 1) is set to q. Then, whenever operation S1220 is performed, the counter of the memory cell C(K, 1) may be decreased by each one. The counter of the memory cell C(k, 1) may be stored in the level change delay logic 510. In an example of an embodiment, in which whether the state changed memory cell exists is not determined, operation S1252 may be omitted.

In operation S1253, the memory cell C(k, 1) is determined to have the second progressing state.

In operation S1260, the memory cell C(k, 1) is determined to have the third progressing state.

In operation S1270, it is determined whether progressing states of all of the memory cells C(k, 1) to C(k, 5) within the page 400-$k$ to be programmed are determined. When the progressing states of the memory cells C(k, 1) to C(k, 5) are determined, operation S1200 is terminated. Otherwise, operation S1230 is performed.

Figure 7:
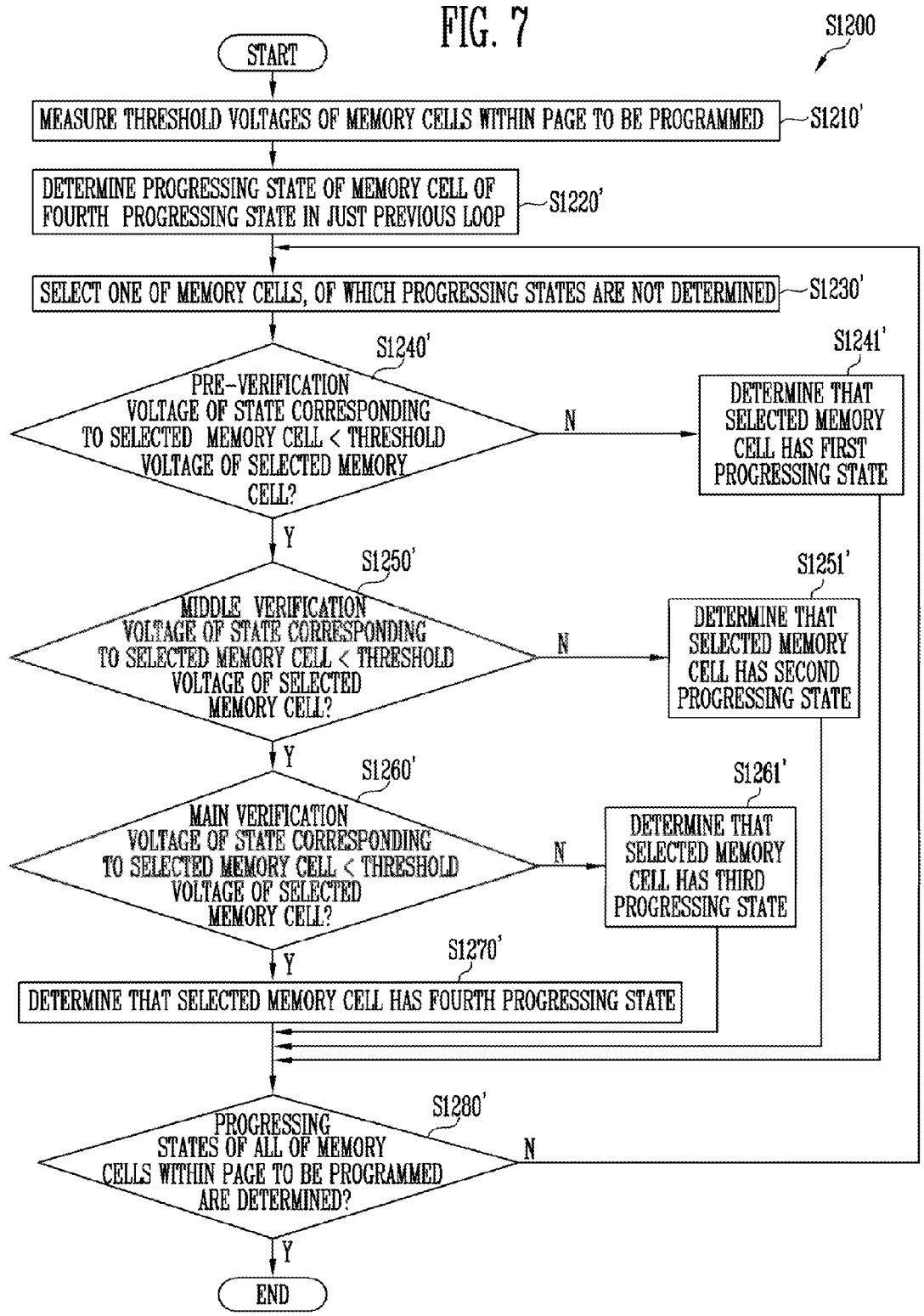
FIG. 7 is a flowchart for describing an example of an embodiment regarding an operation S1200 of FIG. 5.

FIG. 7 is a flowchart for describing an example of an embodiment regarding an operation S1200 of FIG. 5. Hereinafter, operation S1200 will be described with reference to FIGS. 1, 3, 4, 5, and 7.

In operation S1210', the threshold voltages of the memory cells C(k, 1) to C(k, 5) within the page 400-$k$ to be programmed are measured. The threshold voltages of the memory cells C(k, 1) to C(k, 5) within the page 400-$k$ to be programmed are measured by using the total verification voltages VTV1 to VTV17 supplied to the program word line WLK.

In operation S1220', a progressing state of the memory cell, which is in the fourth progressing state in a just previous loop, is determined. The memory cell, which has been in the fourth progressing state, is not programmed or erased, so that the progressing state of the memory cell is not changed any longer. Accordingly, the memory cell, which is determined to have the fourth progressing state once, may be determined to have the fourth progressing state without a separate comparison. In operation S1220', it is assumed that whether the state changed memory cell exists is not determined. Operation S1220' is an optional operation, so that operation S1220' may also be omitted.

In operation S1230', one of the memory cells, of which the progressing states are not determined, is selected. According to an example of an embodiment, when operation S1220' is performed, the progressing state of the memory cell, which has been determined to have the fourth state in the previous loop, may already have been completely determined. One of the memory cells, except for the memory cell, of which the progressing state has been already determined, is selected. When operation S1220' is omitted, one of all of the memory cells C(k, 1) to C(k, 5) is selected. For convenience of the description, it is assumed that the selected memory cell is the memory cell C(k, 1), and the memory cell C(k, 1) needs to be programmed to have the first state P1.

In operation S1240', the threshold voltage of the memory cell C(k, 1) is compared with the pre-verification voltage (PV1=VTV1) of the state P1 corresponding to the memory cell C(k, 1). When the threshold voltage of the memory cell C(k, 1) is smaller than the pre-verification voltage PV1, operation S1241' is performed. When the threshold voltage of the memory cell C(k, 1) is larger than the pre-verification voltage PV1, operation S1250' is performed.

In operation S1241', the memory cell C(k, 1) is determined to have the first progressing state.

In operation S1250', the threshold voltage of the memory cell C(k, 1) is compared with the middle verification voltage (MDV1=VTV2) of the state P1 corresponding to the memory cell C(k, 1). When the threshold voltage of the memory cell C(k, 1) is smaller than the middle verification voltage MDV1, operation S1251' is performed. When the threshold voltage of the memory cell C(k, 1) is larger than the middle verification voltage MDV1, operation S1260' is performed.

In operation S1251', the memory cell C(k, 1) is determined to have the second progressing state.

In operation S1260', the threshold voltage of the memory cell C(k, 1) is compared with the main verification voltage (MV1=VTV3) of the state P1 corresponding to the memory cell C(k, 1). The main verification voltage (MV1=VTV3) of the state P1 may be used as the pre-verification voltage (PV3=VTV3) of the state P3. When the threshold voltage of the memory cell C(k, 1) is smaller than the main verification voltage MV1, operation S1261' is performed. When the threshold voltage of the memory cell C(k, 1) is larger than the main verification voltage MV1, operation S1270' is performed.

In operation S1261', the memory cell C(k, 1) is determined to have the third progressing state.

In operation S1270', the memory cell C(k, 1) is determined to have the fourth progressing state. The memory cell C(k, 1) has the fourth progressing state, the threshold voltage of the memory cell C(k, 1) is not changed any longer.

In operation S1280', it is determined whether progressing states of all of the memory cells C(k, 1) to C(k, 5) within the page 400-k to be programmed are determined. When the progressing states of the memory cells C(k, 1) to C(k, 5) are determined, operation S1200 is terminated. Otherwise, operation S1230' is performed.

Figure 8:
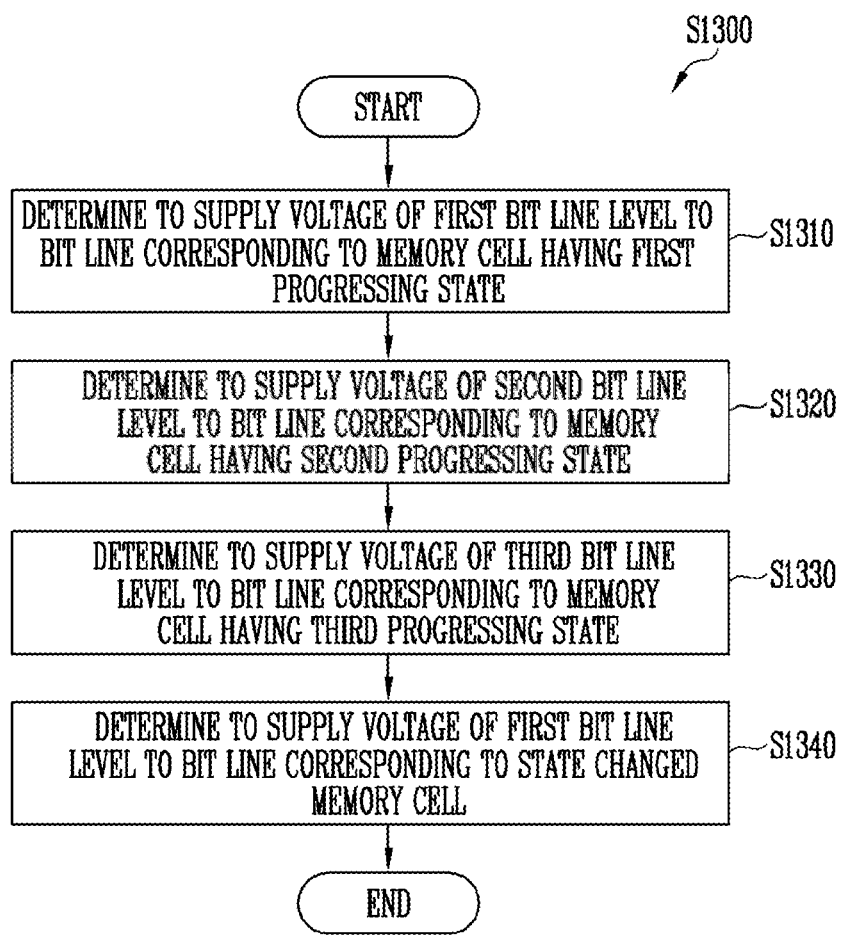
FIG. 8 is a flowchart for describing an example of an embodiment of operation S1300 of FIG. 5.

FIG. 8 is a flowchart for describing an example of an operation S1300 of FIG. 5. Operation S1300 will be described with reference to FIGS. 1, 2, 4, 5, 6, and 8. For convenience of the description, it is assumed that whether the state changed memory cell exists is determined. Further, for convenience of the description, it may be assumed that the memory cell C(k, 1) has the third progressing state, the memory cell C(k, 2) has the second progressing state, the memory cell C(k, 3) has the first progressing state, and the memory cell C(k, 4) is the state changed memory cell.

In operation S1310, it is determined to supply a voltage of a first bit line level to the bit line BL3 corresponding to the memory cell C(k, 1) having the first progressing state. Here, for example, the first bit line level may be a ground GND level.

In operation S1320, it is determined to supply a voltage of a second bit line level to the bit line BL2 corresponding to the memory cell C(k, 2) having the second progressing state. Here, the second bit line level may be larger than the first bit line level. The threshold voltage of the memory cell C(k, 2) is changed by the supply of the program voltage VPGM, but the amount of change of the threshold voltage of the memory cell C(k, 2) by the supply of the program voltage VPGM is smaller than the amount of change of the threshold voltage of the memory cell C(k, 3) by the supply of the program voltage VPGM.

In operation S1330, it is determined to supply a voltage of a third bit line level to the bit line BL1 corresponding to the memory cell C(k, 1) having the third progressing state. Here, the third bit line level may be larger than the second bit line level, and when the voltage of the third bit line level is supplied to the bit line BL1, the threshold voltage of the memory cell C(k, 1) is not changed even though the program voltage VPGM is supplied.

In operation S1340, it is determined to supply the voltage of the first bit line level to the bit line BL4 corresponding to the state changed memory cell C(k, 4). Operation S1340 has a meaning only when whether the state changed memory cell exists is determined, so that operation S1340 is an optional process and may be omitted.

Figure 9:
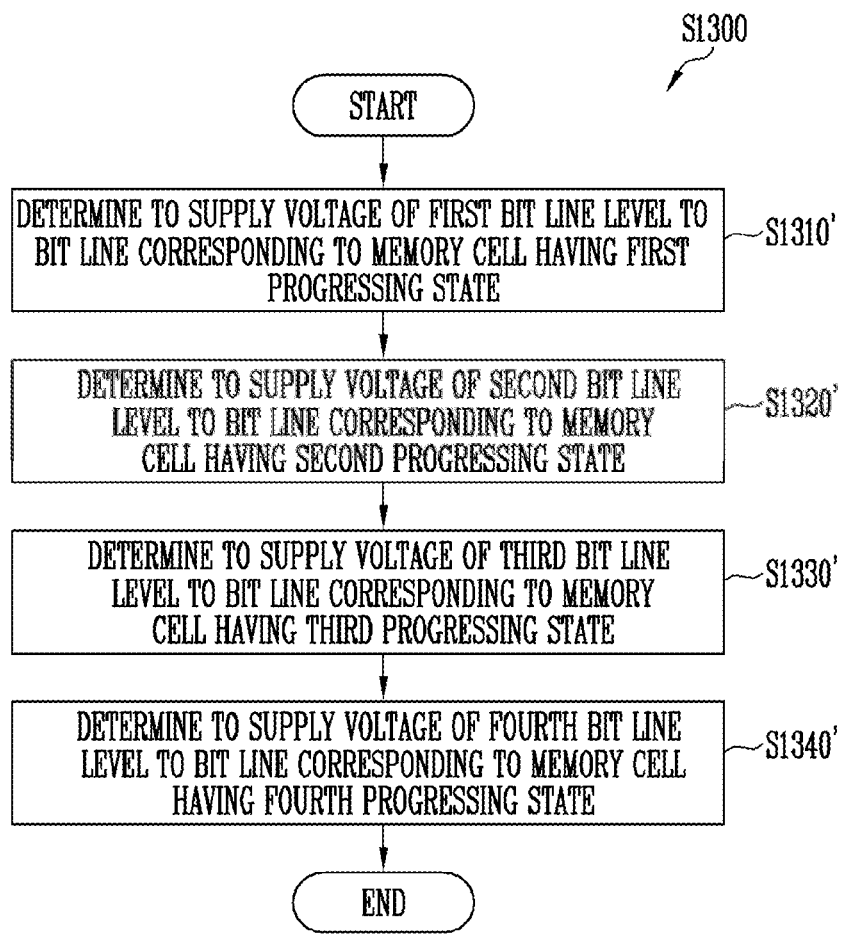
FIG. 9 is a flowchart for describing an example of an embodiment of operation S1300 of FIG. 5.

FIG. 9 is a flowchart for describing an example of an embodiment regarding an operation S1300 of FIG. 5. Operation S1300 will be described with reference to FIGS. 1, 3, 4, 5, 7, and 9. For convenience of the description, it is assumed that the control logic 500 does not determine whether the state changed memory cell exists. Further, for convenience of the description, it may be assumed that the memory cell C(k, 1) has the fourth progressing state, the memory cell C(k, 2) has the third progressing state, the memory cell C(k, 3) has the second progressing state, and the memory cell C(k, 4) has the first progressing state.

In operation S1310', it is determined to supply a voltage of a first bit line level to the bit line BL4 corresponding to the memory cell C(k, 4) having the first progressing state. Here, for example, the first bit line level may be a ground GND level. The threshold voltage of the memory cell C(k, 4) is changed by the supply of the program voltage VPGM.

In operation S1310', it is determined to supply a voltage of a second bit line level to the bit line BL3 corresponding to the memory cell C(k, 3) having the second progressing state. Here, the second bit line level may be larger than the first bit line level. The threshold voltage of the memory cell C(k, 3) is changed by the supply of the program voltage VPGM, but the amount of change of the threshold voltage of the memory cell C(k, 3) by the supply of the program voltage VPGM is smaller than the amount of change of the threshold voltage of the memory cell C(k, 4) by the supply of the program voltage VPGM.

In operation S1330', it is determined to supply a voltage of a third bit line level to the bit line BL2 corresponding to the memory cell C(k, 2) having the third progressing state. Here, the third bit line level may be larger than the second bit line level. The threshold voltage of the memory cell C(k, 2) is changed by the supply of the program voltage VPGM, but the amount of change of the threshold voltage of the memory cell C(k, 2) by the supply of the program voltage VPGM is smaller than the amount of change of the threshold voltage of the memory cell C(k, 3) by the supply of the program voltage VPGM.

In operation S1340', it is determined to supply a voltage of a fourth bit line level to the bit line BL1 corresponding to the memory cell C(k, 1) having the fourth progressing state. Here, the fourth bit line level may be larger than the third bit line level. When the voltage of the fourth bit line level is supplied to the bit line BL1, the threshold voltage of the memory cell C(k, 1) is not changed even though the program voltage VPGM is supplied.

Figure 10:
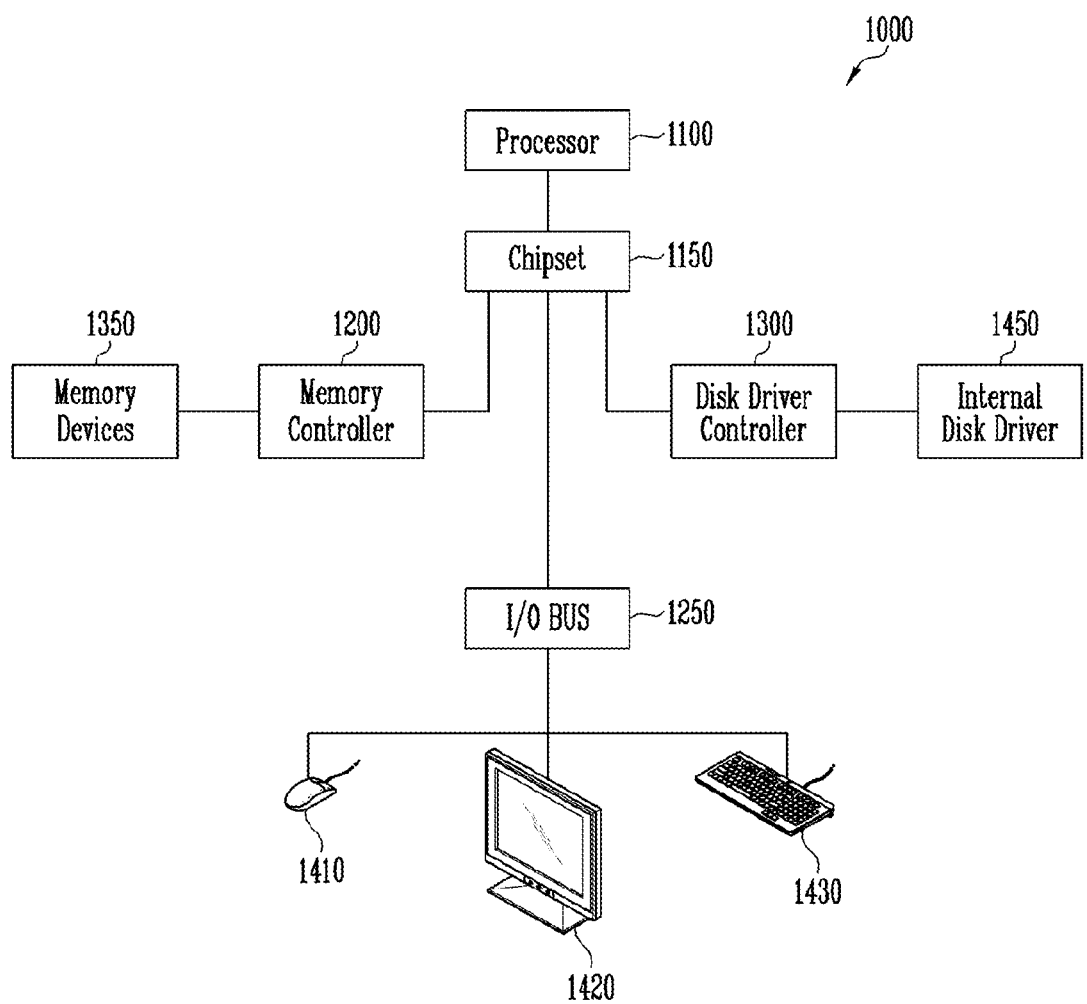
FIG. 10 illustrates a block diagram of an example of a representation of a system employing a semiconductor memory device and or method for operating a semiconductor memory device in accordance with the various embodiments discussed above with relation to FIGS. 1-9.

The semiconductor devices and methods for operating a semiconductor memory device discussed above (see FIGS. 1-9) are particular useful in the design of memory devices, processors, and computer systems. For example, referring to FIG. 10, a block diagram of a system employing a semiconductor device and or method of operating a semiconductor memory device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and or method of operating a semiconductor memory device as discussed above with reference to FIGS. 1-9. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and or method of operating a semiconductor memory device as discussed above with relation to FIGS. 1-9, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 10 is merely one example of a system 1000 employing a semiconductor device and or method of operating a semiconductor memory device as discussed above with relation to FIGS. 1-9. In alternate embodiments, such as, for example but not limited to, cellular phones or digital cameras, the components may differ from the embodiments illustrated in FIG. 10.

As described above, the various embodiments have been disclosed in the drawings and the specification. The specific terms used herein are for purposes of illustration, and do not limit the scope of the description. Accordingly, those skilled in the art will appreciate that various modifications and another equivalent example may be made without departing from the scope and spirit of the present disclosure.

What is claimed is:

1. A method for operating a semiconductor memory device includes a plurality of memory cells configured to have a single program state among first through Nth program states, wherein each one of the first through Nth program states is respectively determined based on threshold voltages of the plurality of memory cells, the method comprising:
   applying a program pulse to a selected word line connected to the plurality of memory cells;
   performing a pre-verification to verify program states of the plurality of memory cells using a pre-verify voltage; and
   performing, if a result of the pre-verification is determined to have passed, a main-verification to verify the program states of the plurality of memory cells using a main-verify voltage,
   wherein the pre-verify voltage of (k)th program state among the first through Nth program states has a same voltage level with the main verify voltage of (k−2)th program state,
   wherein N is a positive integer, and
   wherein k is a positive integer.

2. The method of claim 1, further comprising
  determining, if a threshold voltage of memory cell among the plurality of memory cells is lower than the pre-verify voltage of the (k)th program state, a state of the memory cell to a first progressing state;
  determining, if a threshold voltage of memory cell among the plurality of memory cells is higher than the pre-verify voltage of the (k)th program state and lower than the main-verify voltage of the (k)th program state, a state of the memory cell to a second progressing state; and
  determining, if a threshold voltage of memory cell among the plurality of memory cells is higher than the main-verify voltage of the (k)th program state, a state of the memory cell to a third progressing state.

3. The method of claim 2, further comprising:
  applying a first bit line level voltage to a bit line of the memory cell of the first progressing state, a second bit line level voltage to a bit line of the memory cell of the second progressing state and a third bit line level voltage to a bit line of the memory cell of the third progressing state.

4. The method of claim 2, further comprising:
  determining whether the progressing state of memory cell of the plurality of memory cells changed from the first progressing state to the second progressing state through the applying of the program pulse to the selected word line; and
  setting a voltage level of the program pulse without changing predetermined times of delay if the progressing state of memory cell of the plurality of memory cells has changed from the first progressing state to the second progressing state through the applying of the program pulse to the selected word line.

5. The method of claim 4,
  wherein the predetermined number of times of delay is determined based on at least one of a relative position of the selected word line.

6. A method for operating a semiconductor memory device includes a plurality of memory cells configured to have a single program state among first through Nth program states, wherein each one of the first through Nth program states is respectively determined based on threshold voltages of the plurality of memory cells, the method comprising:
  applying a program pulse to a selected word line connected to the plurality of memory cells;
  performing a pre-verification to verify program states of the plurality of memory cells using a pre-verify voltage;
  performing, if a result of the pre-verification is determined to have passed, a middle-verification to verify the program states of the plurality of memory cells using a mid-verify voltage; and
  performing, if a result of the middle-verification is determined to have passed, a main-verification to verify the program states of the plurality of memory cells using a main-verify voltage,
  wherein the pre-verify voltage of (k)th program state among the first through Nth program states has a same voltage level with the main verify voltage of (k−2)th program state and the middle verify voltage of (k−1)th program state,
  wherein N is a positive integer, and
  wherein k is a positive integer.

7. The method of claim 6, further comprising:
  determining, if a threshold voltage of memory cell among the plurality of memory cells is lower than the main-verify voltage of the (k)th program state, a state of the memory cell to a first progressing state;
  determining, if a threshold voltage of memory cell among the plurality of memory cells is higher than the main-verify voltage of the (k)th program state and lower than the main-verify voltage of the (k+1)th program state, a state of the memory cell to a second progressing state;
  determining, if a threshold voltage of memory cell among the plurality of memory cells is higher than the main-verify voltage of the (k+1)th program state and lower than the main-verify voltage of the (k+2)th program state, a state of the memory cell to a third progressing state; and
  determining, if a threshold voltage of memory cell among the plurality of memory cells is higher than the main-verify voltage of the (k+2)th program state, a state of the memory cell to a fourth progressing state.

8. The method of claim 7, further comprising:
  applying a first bit line level voltage to a bit line of the memory cell of the first progressing state, a second bit line level voltage to a bit line of the memory cell of the second progressing state, a third bit line level voltage to a bit line of the memory cell of the third progressing state and a fourth bit line of the memory cell of the fourth progressing state.

9. The method of claim 7 further comprising:
  determining whether the progressing state of memory cell of the plurality of memory cells changed from the first progressing state to the second progressing state or from the second progressing state to the third progressing state through the applying of the program pulse to the selected word line; and
  setting a voltage level of the program pulse without changing predetermined times of delay if the progressing state of memory cell of the plurality of memory cells has changed from the first progressing state to the second progressing state through the applying of the program pulse to the selected word line.

10. The method of claim 8,
  wherein the predetermined number of times of delay is determined based on at least one of a relative position of the selected word line.

11. A semiconductor memory device, comprising:
  a memory cell array including a plurality of memory cells configured to have a single program state among first through Nth program states, wherein each one of the first through Nth program states is respectively determined based on threshold voltages of the plurality of memory cells; and
  a control logic configured to apply a program pulse to a selected word line connected to the plurality of memory cells, to perform a pre-verification to verify program states of the plurality of memory cells using a pre-verify voltage and to perform, if a result of the pre-verification is determined to have passed, a main-verification to verify the program states of the plurality of memory cells using a main-verify voltage,
  wherein the pre-verify voltage of (k)th program state among the first through Nth program states has a same voltage level with the main verify voltage of (k−2)th program state,
  wherein N is a positive integer, and
  wherein k is a positive integer.

12. The semiconductor memory device of claim 11, further comprising:
  a voltage generating unit configured to generate the program pulse, the pre-verify voltage and the main-verify voltage supplied to the selected word line.

13. The semiconductor memory device of claim 11,
wherein the control logic is further configured to determine, if a threshold voltage of a memory cell among the plurality of memory cells is lower than the pre-verify voltage of the (k)th program state, a state of the memory cell to a first progressing state, to determine, if a threshold voltage of a memory cell among the plurality of memory cells is higher than the pre-verify voltage of the (k)th program state and lower than the main-verify voltage of the (k)th program state, a state of the memory cell to a second progressing state and to determine, if a threshold voltage of a memory cell among the plurality of memory cells is higher than the main-verify voltage of the (k)th program state, a state of the memory cell to a third progressing state.

14. The semiconductor memory device of claim 11,
wherein the control logic is further configured to apply a first bit line level voltage to a bit line of the memory cell of the first progressing state, a second bit line level voltage to a bit line of the memory cell of the second progressing state and a third bit line level voltage to a bit line of the memory cell of the third progressing state.

15. The semiconductor memory device of claim 12,
wherein the control logic is further configured to determine whether the progressing state of a memory cell of the plurality of memory cells changed from the first progressing state to the second progressing state through the applying of the program pulse to the selected word line and to set a voltage level of the program pulse without changing predetermined times of delay if the progressing state of memory cell of the plurality of memory cells has changed from the first progressing state to the second progressing state through the applying of the program pulse to the selected word line.

16. The semiconductor memory device of claim 15
wherein the predetermined number of times of delay is determined based on at least one of a relative position of the selected word line.

* * * * *